United States Patent [19]
Smith et al.

[11] Patent Number: 5,942,948
[45] Date of Patent: Aug. 24, 1999

[54] HIGH SPEED LOCK DETECTOR

[75] Inventors: Patrick R. Smith, Garland; Kevin M. Ovens, Plano, both of Tex.

[73] Assignee: Texas Instruments Incorporated, Dallas, Tex.

[21] Appl. No.: 08/993,874

[22] Filed: Dec. 18, 1997

Related U.S. Application Data

[60] Provisional application No. 60/033,729, Dec. 20, 1996.

[51] Int. Cl.⁶ .................................................. H03L 7/087
[52] U.S. Cl. ................................ 331/8; 331/1 A; 331/25; 331/DIG. 2; 327/7; 327/12; 327/159
[58] Field of Search ........................... 331/8, 25, DIG. 2, 331/1 A; 327/7, 12, 159

[56] References Cited

U.S. PATENT DOCUMENTS 5,180,933  1/1993  Krzyzanowski ................... 331/DIG. 2
5,256,989  10/1993  Parker et al. ............................ 331/1 A

*Primary Examiner*—Siegfried H. Grimm
*Attorney, Agent, or Firm*—Robby T. Holland; Carlton H. Hoel; Richard L. Donaldson

[57] ABSTRACT

A lock detector (16) includes a set circuit (64), a reset circuit (120), and a latch circuit (80). The latch circuit (80) provides an output signal (82) in response to the temporal relationship of the first input signal (12) and the second input signal (14). The set circuit (64) initiates the transition of the latch circuit (80) to the locked state, while the reset circuit (120) initiates the transition of the latch circuit (80) to the not-locked state.

20 Claims, 4 Drawing Sheets

HIGH SPEED LOCK DETECTOR

This Appln claims the benefit of U.S. Provisional Appln No. 60/033,729 filed Dec. 20, 1996.

TECHNICAL FIELD OF THE INVENTION

This invention relates in general to the field of phase lock loops and more specifically to a high speed lock detector.

BACKGROUND OF THE INVENTION

The phase lock loop is commonly used in digital circuitry to synchronize clock signals. Its application includes, for example, anything requiring clock synchronization or clock synthesis, such as radar applications and telecommunications. Continuing advances in technology have resulted in an increase in the operating speed of electrical devices. Unfortunately, the speed of lock detectors in the phase lock loop has not increased at a pace sufficient to keep up with technology.

Current lock detectors incorporate multiple logic devices that cause significant logic delays. These delays limit the maximum operating frequency of current lock detectors. One technique to incorporate these frequency limited lock detectors in higher frequency circuitry reduces the clock signal frequency prior to presentation to the lock detector. This results in increased overhead due to additional elements placed in the phase lock loop, and introduces more error sources and potential for device failure.

SUMMARY OF THE INVENTION

Accordingly, a need has arisen for a high speed lock detector that operates in high speed circuitry without the need of additional dividing or multiplying circuitry. According to the teachings of the present invention, a lock detector is provided that addresses the disadvantages and problems associated with previously used lock detectors.

A lock detector circuit includes a latch circuit that generates an output signal in response to the temporal relationship of a first signal and a second signal. The latch circuit includes a first cross-coupled transistor latch that is coupled to a first reference potential, and a second cross coupled transistor latch coupled to the first cross coupled transistor latch and a second reference potential. A set circuit is coupled to the latch circuit and is operable to transition the latch circuit to a locked state. A reset circuit is coupled to the latch circuit and is operable to transition the latch circuit to a not-locked state.

A technical advantage of the present invention is the ability of the lock detector to operate in high speed circuitry without additional dividing or multiplying circuitry. Another technical advantage is that flexible design characteristics provide for increased reliability and enhanced operation. Other technical advantages are apparent to one skilled in the art in view of the attached description, drawings, and claims.

BRIEF DESCRIPTION OF THE DRAWINGS

For a more complete understanding of the present invention and the advantages thereof, reference is now made to the following description taken in conjunction with the accompanying drawings, in which.

DETAILED DESCRIPTION OF THE INVENTION

Figure 1:
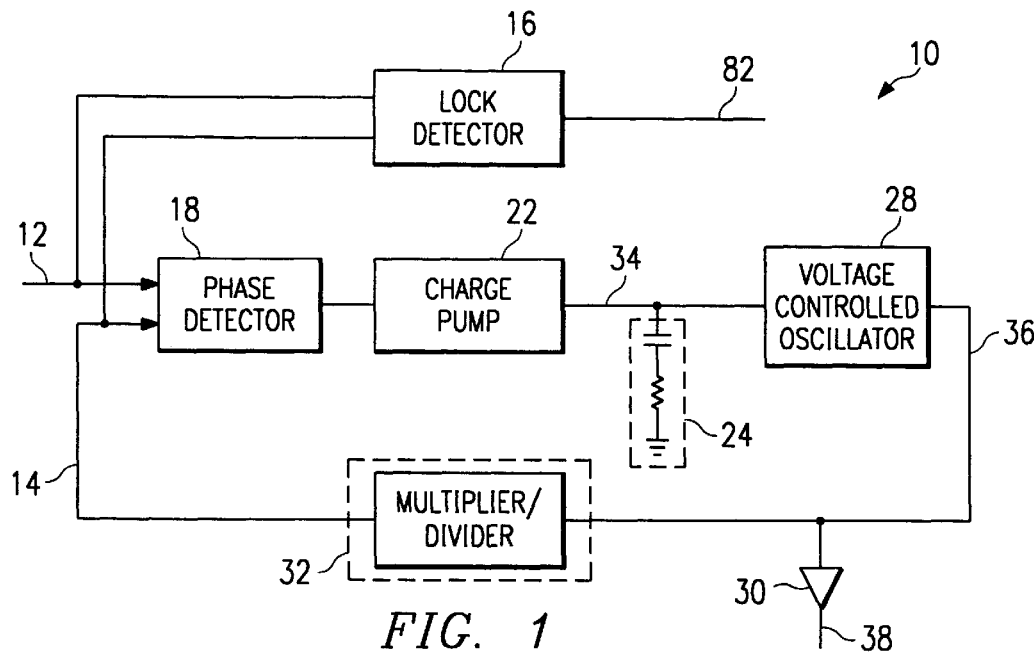
FIG. 1 is a schematic diagram of a phase lock loop having a lock detector according to the present invention.

FIG. 1 illustrates a phase lock loop 10 that includes a first input signal 12 and a second input signal 14. In one embodiment, first input signal 12 is a reference clock, and second input signal 14 is a feedback input clock. In general, a lock detector 16 operates at high frequencies, such as frequencies greater than one gigahertz, to detect whether input signals 12 and 14 are in-phase.

Phase lock loop 10 also includes a phase detector 18 coupled to a charge pump 22. Charge pump 22 is coupled to a voltage controlled oscillator 28 over a line having an optional filtering circuit 24. Voltage controlled oscillator 28 is coupled to a clock buffer 30 and an optional multiplier/divider 32. The output of multiplier/divider 32 is fed into lock detector 16 and phase detector 18 as second input signal 14.

In operation, lock detector 16 is operable to determine whether first input signal 12 and second input signal 14 are in-phase (locked) or out-of-phase (not locked). Lock detector 16 may visibly indicate to a user whether input signals 12 and 14 are locked or not-locked. Phase detector 18 receives signals 12 and 14 and detects the phase difference, if any, between signals 12 and 14. Phase detector 18 drives charge pump 22, which in turn supplies a control signal 34 to voltage controlled oscillator 28 to increase or decrease the frequency of an oscillator output 36. Filtering circuitry 24 may alter the condition of control signal 34 in frequency, amplitude, or other characteristic for proper presentation to voltage controlled oscillator 28. Oscillator output 36 may then be buffered by clock buffer 30, and provided as a clock signal 38 for use in other circuitry.

In one embodiment, lock detector 16 may have a maximum operating frequency that is less than the frequency of clock signal 38. In such a case, multiplier/divider 32 divides oscillator output 36 before presentation to lock detector 16. However, the present invention enables lock detector 16 to operate at frequencies of one gigahertz or greater, which may eliminate the need for multiplier/divider 32 while providing faster and more reliable operation.

Figure 2:
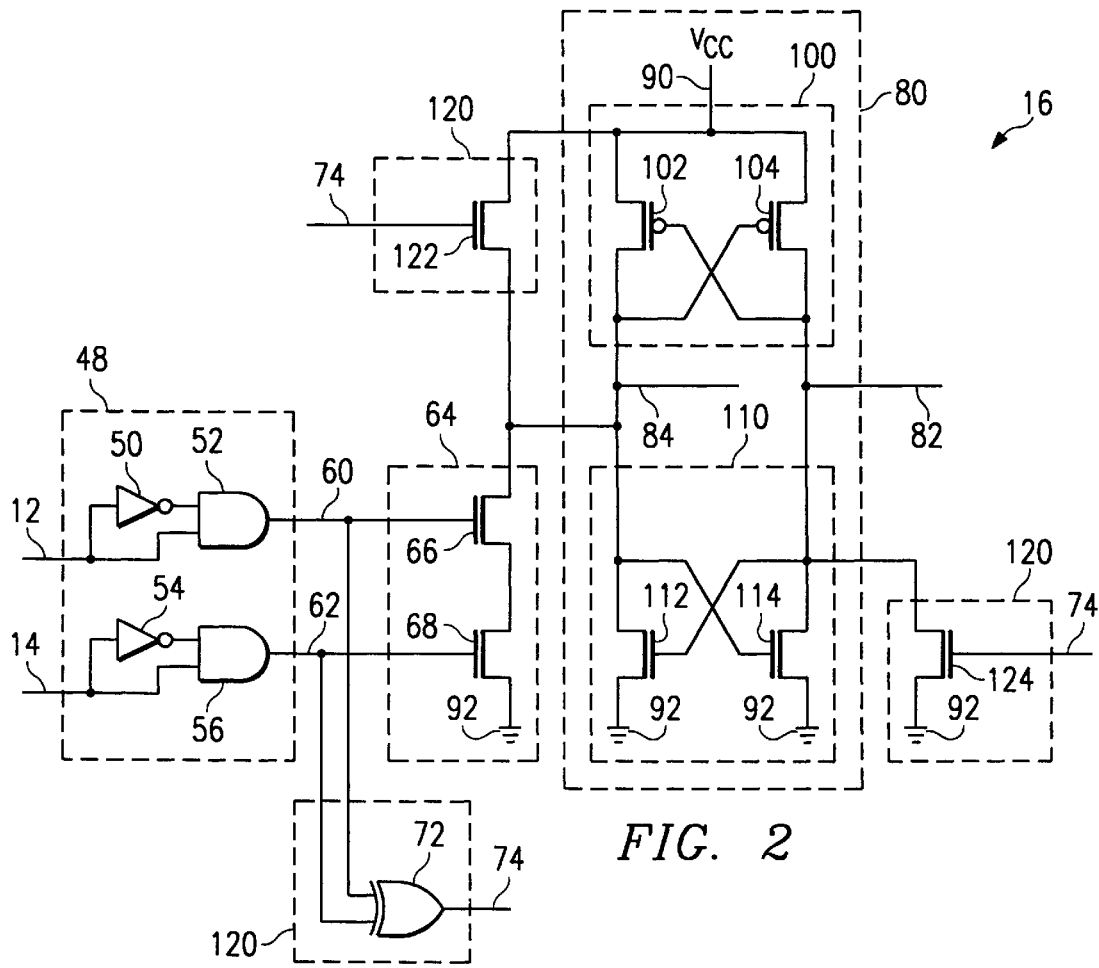
FIG. 2 is a detailed circuit diagram of the lock detector.

FIG. 2 illustrates a detailed circuit diagram of lock detector 16. Lock detector 16 includes an input circuit 48, a set circuit 64, several portions of a reset circuit 120, and a latch circuit 80. Input circuit 48 receives first input signal 12 and second input signal 14. Input circuit 48 comprises a first inverter 50 and a first AND gate 52. First input signal 12 is provided to an input of first inverter 50 and to a second input of first AND gate 52. An output of first inverter 50 is coupled to a first input of first AND gate 52. An output of first AND gate 52 provides a first set signal 60. Input circuit 48 further comprises a second inverter 54 and a second AND gate 56. Second input signal 14 is provided to an input of second inverter 54 and to a second input of second AND gate 56. An output of second inverter 54 is coupled to a first input of second AND gate 56. An output of second AND gate 56 provides a second set signal 62.

Set circuit 64 includes a first set NMOSFET 66 and a second set NMOSFET 68. First set signal 60 is provided to the gate of first set NMOSFET 66, and second set signal 62 is provided to the gate of second set NMOSFET 68. First set NMOSFET 66 and second set NMOSFET 68 are connected in series, such that the source of first set NMOSFET 66 is coupled to the drain of second set NMOSFET 68. The source of second set NMOSFET 68 is coupled to a second reference potential 92, which may be ground.

Latch circuit 80 comprises a first cross-coupled transistor latch 100, which includes a first latch PMOSFET 102 and a second latch PMOSFET 104. PMOSFETs 102 and 104 have sources coupled to a first reference potential 90 (generally referred to as $V_{cc}$) and cross-coupled drain-to-gate connections. The drain of first latch PMOSFET 102 and the gate of second latch PMOSFET 104 are also coupled to the drain of first set NMOSFET 66.

Latch circuit 80 further includes a second cross-coupled transistor latch 110, which includes a first latch NMOSFET 112 and second latch NMOSFET 114. NMOSFETs 112 and 114 have sources coupled to second reference potential 92 and cross-coupled drain-to-gate connections. The drain of first latch NMOSFET 112 and the gate of second latch NMOSFET 114 are also coupled to the drain of first set NMOSFET 66. The gate of first latch NMOSFET 112 and the drain of second latch NMOSFET 114 are coupled to the gate of first latch PMOSFET 102 and the drain of second latch PMOSFET 104. The drain of second latch NMOSFET 114 provides output signal 82. The drain of first latch NMOSFET 112 provides inverse output signal 84.

Reset circuit 120 comprises an EXCLUSIVE-OR gate 72, a first reset NMOSFET 122, and a second reset NMOSFET 124. EXCLUSIVE-OR gate 72 receives first set signal 60 and second set signal 62 as inputs, and provides on its output a reset signal 74 to the gates of NMOSFET 122 and NMOSFET 124. First reset NMOSFET 122 has a drain coupled to first reference potential 90 and a source coupled to the drain of first set transistor 66. Second reset NMOSFET 124 has a drain coupled to the drain of second latch PMOSFET 104 and a source coupled to second reference potential 92.

In operation, input circuit 48 is operable to one-shot first input signal 12 and second input signal 14, providing first set signal 60 and second set signal 62. One-shotting input signals 12 and 14 decreases the pulse widths to the delay time of inverters 50 and 54. Accordingly, the pulse widths of set signals 60 and 62 are adjustable by using faster or slower inverters 50 and 54. Input circuit 48 may decrease the pulse width from approximately fifty nanoseconds for input signals 12 and 14 to approximately three hundred picoseconds for set signals 60 and 62. Having passed through identical circuitry, the phase difference between set signals 60 and 62 is the same as the phase difference between input signals 12 and 14. Narrowing the input pulse width provides advantages discussed in detail below with respect to FIG. 3D. The pulses of set signals 60 and 62 are provided to set circuit 64 and reset circuit 120.

Latch circuit 80 operates as memory circuit, operable in a locked state and a not-locked state. Latch circuit 80 operates in the locked state when input signals 12 and 14 are locked. In the locked state, output signal 82 provides a constant high signal (inverse output signal 84 provides a constant low signal), though signals 12 and 14 fluctuate high and low. In the not-locked state, output signal 82 provides a constant low signal (inverse output signal 84 provides a constant high signal), though signals 12 and 14 fluctuate high and low.

Set circuit 64 triggers the transition of latch circuit 80 from the not-locked state to the locked state. Set circuit 64 initiates this transition when an existing phase difference between input signals 12 and 14 has been removed, and signals 12 and 14 have become locked. Reset circuit 120 triggers the transition of latch circuit 80 from the locked state to the not-locked state. Reset circuit 120 initiates this transition when a phase difference occurs between signals 12 and 14.

Set circuit 64 and reset circuit 120 operate approximately as long as the pulse time of set signals 60 and 62. Once either transition of latch circuit 80 is initiated, however, latch circuit 80 is operable to maintain the new state independent of set circuit 64 or reset circuit 120. For example, after the initial triggering, set circuit 64 does not effect the operation of latch circuit 80 operating in the locked state. Similarly, after the initial triggering, reset circuit 120 does not effect the operation of latch circuit 80 operating in the not-locked state.

The MOSFET transistors of latch circuit 80 operate as switches that are activated or deactivated according to the status of their gate inputs. An active MOSFET has a closed drain-to-source (NMOSFET) or source-to-drain (PMOSFET) connection. An inactive MOSFET has an open drain-to-source (NMOSFET) or source-to-drain (PMOSFET) connection. An NMOSFET is active when the gate input is high and inactive when the gate input is low, while a PMOSFET is active when the gate input is low, and inactive when the gate input is high. FIG. 2 indicates a PMOSFET by an inverted gate input; a low signal at the gate of a PMOSFET is inverted to a high signal, activating the PMOSFET.

Latch circuit 80 transitions to the locked state when input signals 12 and 14 are in-phase, and correspondingly, when set signals 60 and 62 are in-phase. As a result, reset signal 74 is low and reset NMOSFETs 122 and 124 are inactive. The high pulses of first set signal 60 and second set signal 62 simultaneously activate first set NMOSFET 66 and second NMOSFET set 68, providing second reference potential 92 to the gate of second latch PMOSFET 104, activating it, and to the gate of second latch NMOSFET 114, deactivating it. Activating second latch PMOSFET 104 provides first reference potential 90 to the gate of first latch PMOSFET 102, deactivating it, and to the gate of first latch NMOSFET 112, activating it.

Since set signals 60 and 62 have very narrow pulses, set NMOSFETs 66 and 68 remain activated for a relatively short time. The brief connection to second reference potential 92 provided by the simultaneous activation of set NMOSFETs 66 and 68, however, is sufficient to trigger the transition of latch circuit 80 to the locked state. Once the transition is triggered, first latch NMOSFET 112 provides second reference potential 92 to the gate of second latch PMOSFET 104. First cross-coupled transistor latch 100 and second cross-coupled transistor latch 110 now operate together to maintain continuous activation of second latch PMOSFET 104 and first latch NMOSFET 112, and continuous inactivation of first latch PMOSFET 102 and second latch NMOSFET 114. Thus, latch circuit 80 stays in the locked state without the connection to second reference potential 92 provided by set circuit 64. Though set signals 60 and 62 fluctuate high and low, latch circuit 80 continuously provides first reference potential 90 to output signal 82 (and second reference potential 92 to inverse output signal 84) as long as input signals 12 and 14 remain locked.

Latch circuit 80 transitions to the not-locked state when input signals 12 and 14, and correspondingly, set signals 60 and 62, are out-of-phase. As a result, first set NMOSFET 66 and second set NMOSFET 68 are not active simultaneously. The possibility of set signals 60 and 62 overlapping while not locked is discussed in detail below, with reference to FIG. 3D. The out-of-phase condition between set signals 60 and 62 causes reset signal 74 to transition high, activating first reset NMOSFET 122 and second reset NMOSFET 124. Activating NMOSFET 122 provides first reference potential 90 to the gate of second latch PMOSFET 104, deactivating it, and the gate of second latch NMOSFET 114, activating it. Activating NMOSFET 124 (or second latch NMOSFET 114) provides second reference potential 92 to the gate of first latch PMOSFET 102, activating it, and to the gate of first latch NMOSFET 112, deactivating it.

Similar to the discussion above with respect to the operation of latch circuit 80 in the locked state, the brief connection to first reference potential 90 provided by the activation of first reset NMOSFET 122, and the brief connection to second reference potential 92 provided by the activation of second reset NMOSFET 124, are sufficient to trigger the transition of latch circuit 80 to the not-locked state. First cross-coupled transistor latch 100 and second cross-coupled transistor latch 110 now operate together to maintain continuous activation of first latch PMOSFET 102 and second latch NMOSFET 114, and continuous inactivation of second latch PMOSFET 104 and first latch NMOSFET 112. Thus, latch circuit 80 stays in the not-locked state without the connection to reference potentials 90 and 92 provided by reset circuit 120. Though set signals 60 and 62 fluctuate high and low, latch circuit 80 continuously provides second reference potential 92 to output signal 82 (and first reference potential 90 to inverse output signal 84) until input signals 12 and 14 become locked.

It is understood that reset circuit 120 may not require both first reset NMOSFET 122 and second reset NMOSFET 124 in order to initiate the transition of latch circuit 80 to the not-locked state, depending on the electrical characteristics of components in lock detector 16. In a manner similar to the triggering effect of set circuit 64, the triggering effect of reset circuit 120 may be performed by either first reset NMOSFET 122 or second reset NMOSFET 124. However, in a particular embodiment, including both first reset NMOSFET 122 and second reset NMOSFET 124 in lock detector 16 may provide enhanced performance and reliability. Similarly, a second set circuit (not shown) coupled to first reference potential 90 and the drain of second latch PMOSFET 104 may enhance the performance and reliability of set circuit 64. It is understood that the composition of set circuit 64 and reset circuit 120 can be designed in order to provide desirable timing and redundancy characteristics of lock detector 16.

FIGS. 3A–3D are timing diagrams illustrating the operational characteristics of lock detector 16. FIGS. 3A–3D show the digital status (high or low) of first input signal 12, second input signal 14, first set signal 60, second set signal 62, reset signal 74, and output signal 82. Reset signal 74 and output signal 82 may reflect the dynamic or transitional response of latch circuit 80. it is understood that signals 12, 14, 60, and 62 may also have dynamic responses, however, any such dynamics are not indicated in FIGS. 3A–3D.

Figure 3A:
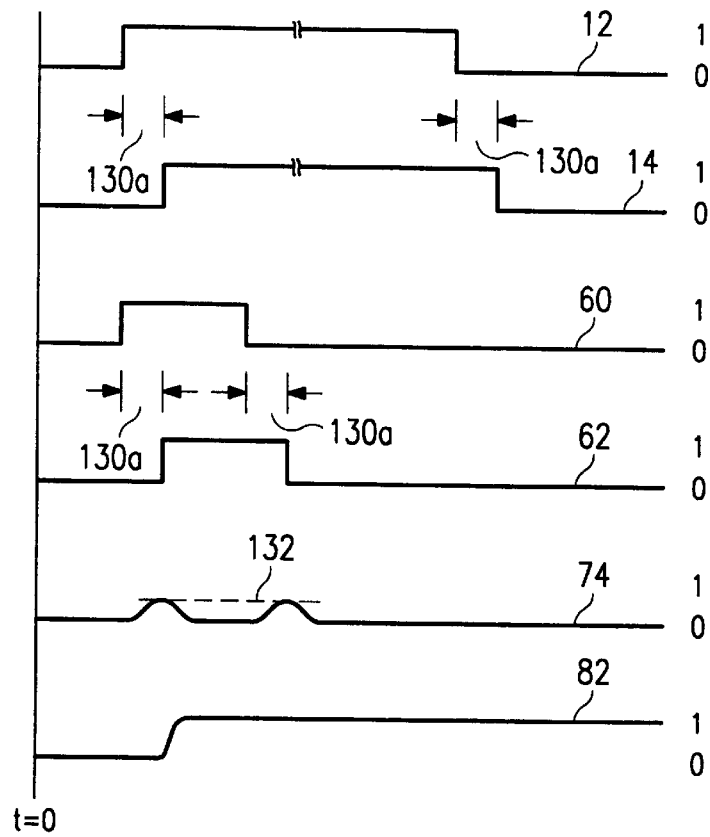
FIGS. 3A–3D are timing diagrams depicting the operational characteristics of the lock detector.

FIG. 3A illustrates the transition of lock detector 16 from the not-locked state to the locked state. Input signals 12 and 14 differ in phase by a phase difference 130a. Correspondingly, set signals 60 and 62 differ in phase by phase difference 130a. A threshold 132 represents the point at which the voltage of reset signal 74 is considered a logic high. Since EXCLUSIVE-OR gate 72 has an inherent transition time, the exclusive-or condition must exist for at least this transition time before reset signal 74 transitions high. In FIG. 3A, reset signal 74 does not reach threshold 132 before the exclusive-or condition of set signals 60 and 62 ends. Therefore, reset signal 74 remains low and reset NMOSFETs 122 and 124 are inactive. Set circuit 64 triggers the transition of latch circuit 80 to the locked state as soon as first set NMOSFET 66 and second set NMOSFET 68 are simultaneously active. Accordingly, output signal 82 begins to transition high when the lagging input signal activates the set NMOSFET to which it is provided. In FIG. 3A, this occurs when second set signal 62 activates second set NMOSFET 68.

FIG. 3A illustrates that input signals 12 and 14 do not have to be completely in phase in order for lock detector 16 to remain in or transition to the locked state. This results from the transition time of EXCLUSIVE-OR gate 72. Phase difference 130a represents the maximum phase difference between signals 12 and 14 for which reset circuit 120 will not initiate the transition of latch circuit 80 to the not-locked state. As long as signals 12 and 14 differ in phase by phase difference 130a or less, lock detector 16 will indicate that signals 12 and 14 are locked. Thus, the transition time of EXCLUSIVE-OR gate 72 determines the tolerance of lock detector 16.

Figure 3B:
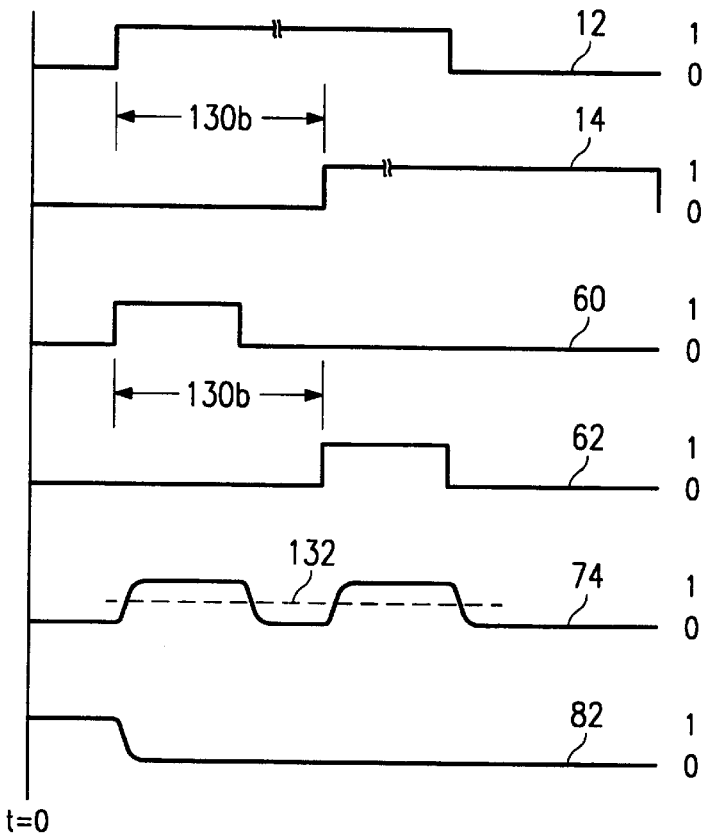

FIG. 3B illustrates the transition of lock detector 16 from the locked state to the not-locked state. Input signals 12 and 14 and set signals 60 and 62 differ in phase by phase difference 130b. Phase difference 130b represents a longer time than the transition time of EXCLUSIVE-OR gate 72. Therefore, reset signal 74 transitions high. In accordance with the operation discussed in detail above with reference to FIG. 2, this initiates the transition of latch circuit 80 to the not-locked state, and output signal 82 transitions low.

FIG. 3B further illustrates that reset signal 74 does not need to remain high for latch circuit 80 to maintain operation in the not-locked state. Since set circuit 64 initiates the transition of latch circuit 80 to the locked state, a low signal at reset signal 74 does not affect the operation of latch circuit 80 operating in the not-locked state. Since set signals 60 and 62 do not overlap in FIG. 3B, latch circuit 80 maintains operation in the not-locked state when reset signal 74 transitions low.

Figure 3C:
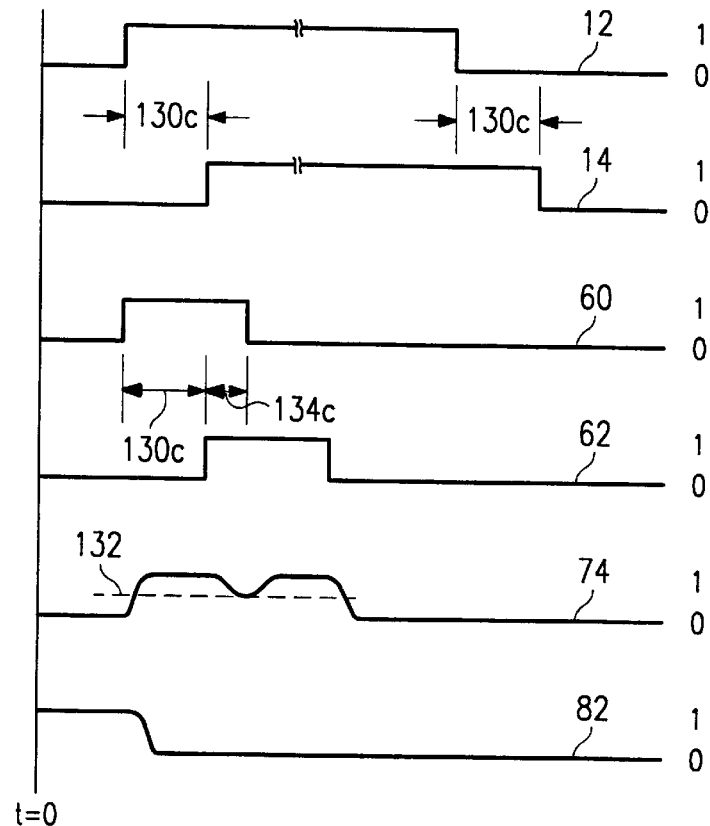

FIG. 3C illustrates another transition of lock detector 16 from the locked to the not-locked state, and illustrates similar characteristics to those of FIG. 3A. The phase difference of set signals 60 and 62 is sufficient to cause reset signal 74 to transition high. However, signals 60 and 62 overlap for an overlap time 134c. Overlap time 134c is less than the transition time of EXCLUSIVE-OR gate 72. Accordingly, reset signal 74 does not fall below threshold 132 before the exclusive-or condition is restored. Thus, latch circuit 80 maintains operation in the not-locked state.

FIG. 3C presents the possibility of first reference potential 90 being shorted to second reference potential 92, since during overlap time 134c, first set transistor 66, second set transistor 68, first reset transistor 122, and second reset transistor 124 are simultaneously active. This condition can be eliminated by coordinating the timing characteristics of first inverter 50, second inverter 54, and EXCLUSIVE-OR gate 72. For example, if the transition time of EXCLUSIVE-OR gate 72 is greater than the delay time of inverters 50 and 54, the potential short is not possible. In such an embodiment, if phase difference 130c is long enough to transition reset signal 74 high, there can be no overlap. This illustrates the flexibility of lock detector 16 of the present invention.

Figure 3D:
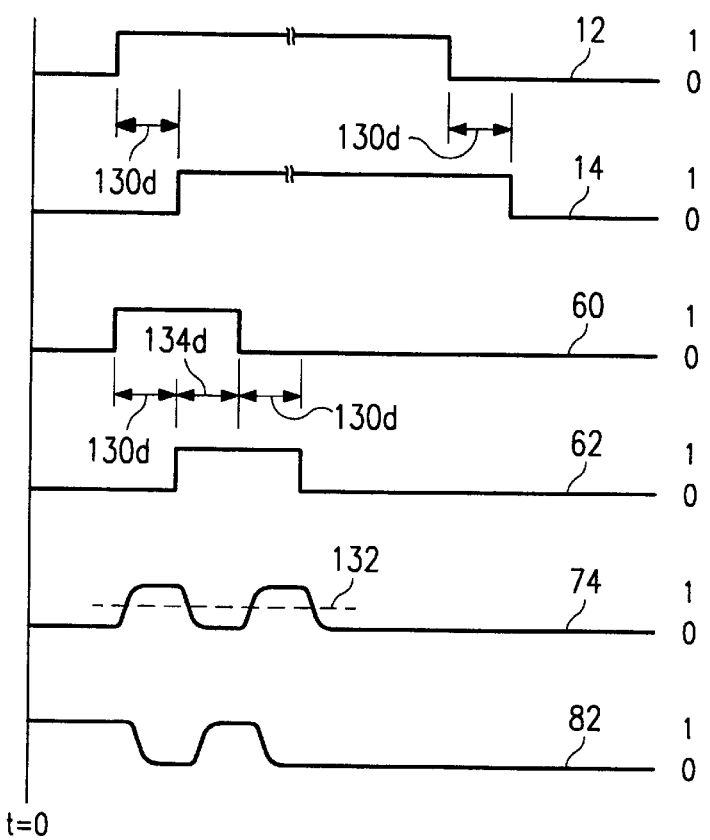

FIG. 3D illustrates a situation where output signal 82 may indicate that input signals 12 and 14 are locked when they are not locked. In this case, overlap time 134d is sufficient to cause reset signal 74 to transition low. However, during that time, set signals 60 and 62 are both high. As a result, set circuit 64 will initiate the transition of lock circuit 80 to the locked state. Depending on the electrical characteristics and response time of lock detector 16, output signal 82 may show a false locked condition 136 during this time.

Such a false locked indication may be undesirable. One of the advantages of the present invention, however, is the adjustability of the operational characteristics of lock detector 16. False locked condition 136 can be eliminated by coordinating the timing characteristics of first inverter 50, second inverter 54, and EXCLUSIVE-OR gate 72. For example, if the transition time of EXCLUSIVE-OR gate 72 is greater than one-half of the delay time of inverters 50 and 54, false locked condition 136 will not occur. In such an embodiment, if phase difference 130 is long enough to transition EXCLUSIVE-OR gate 72 high, then overlap time 134d cannot be long enough for EXCLUSIVE-OR gate 72 to transition low. Alternatively, a suitable low-pass filter circuit (not shown) may be implemented on output signal 82 to remove such short pulses in output signal 82.

On the other hand, false locked condition 136 may not be problematic. In some implementations, output 82 of lock detector 16 provides a visible indication of the phase relationship of input signals 12 and 14, for example, by controlling an indicator light. False locked condition 136 may have a duration on the order of twenty-five picoseconds. A twenty-five picosecond variation of the indicator light may be unnoticeable.

Figure 4:
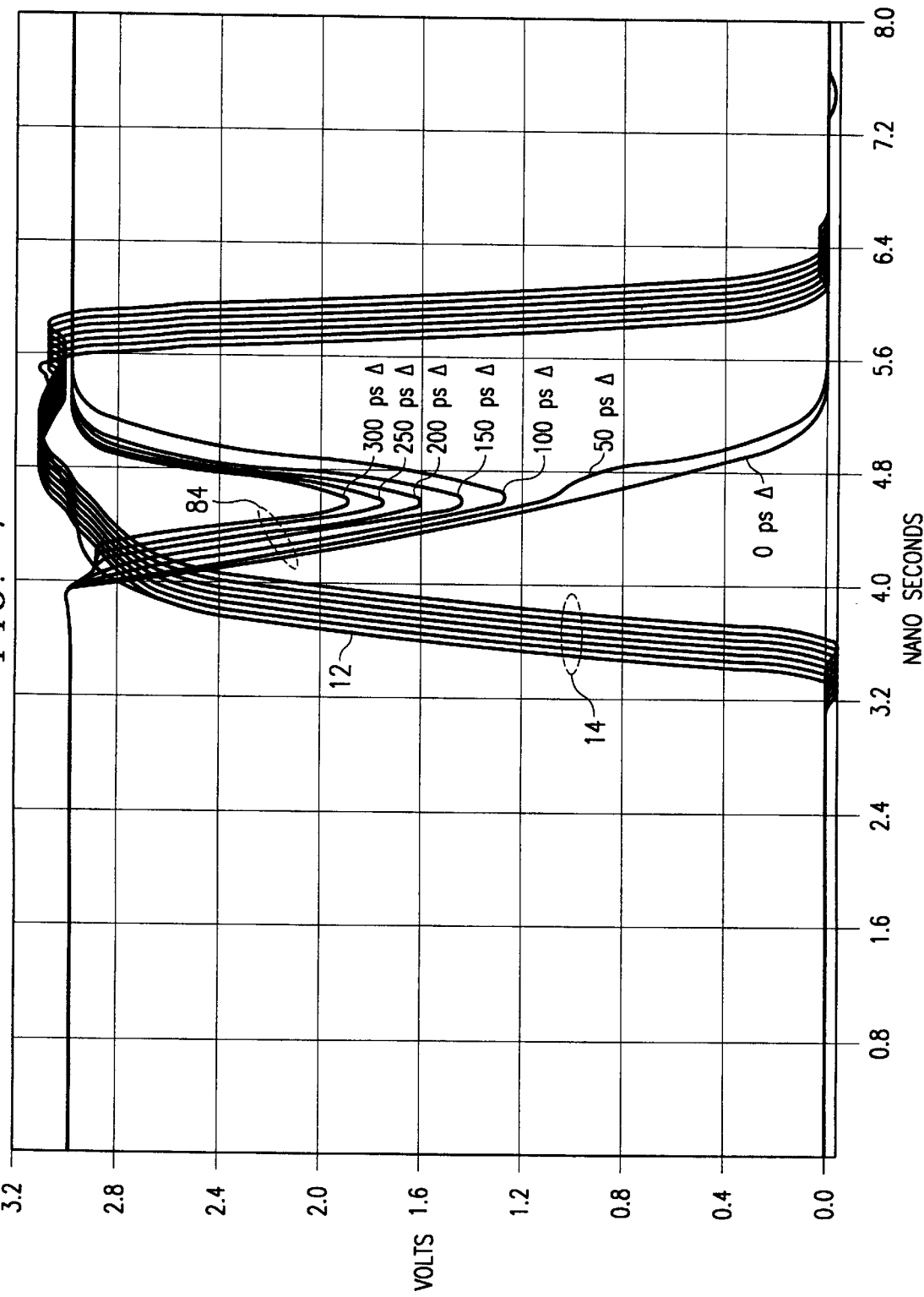
FIG. 4 is a graph illustrating the operational timing characteristics of the lock detector of the present invention under a series of test conditions.

FIG. 4 illustrates operational timing characteristics of lock detector 16 under a series of test conditions. The phase difference between first input signal 12 and second input signal 14 is varied from zero to three hundred picoseconds, in fifty picosecond increments, as indicated by the delta numbers provided in FIG. 4. For each test case, inverse output signal 84 is shown. The locked operational state of latch circuit 80 is indicated by a low output at inverse output signal 84. Inverse output signal 84 transitions low for the zero picosecond phase difference and the fifty picosecond phase difference, indicating a locked condition. In the remaining test cases, inverse output signal 84 remains high, indicating that lock detector 16 recognizes that input signals 12 and 14 are not locked.

The fifty picosecond phase difference test case illustrates the timing tolerance described in detail above with reference to FIG. 3A. The slight bend in inverse output signal 84 for the fifty picosecond delta corresponds with the partial transition high of reset signal 74 in FIG. 3A. Inverse output signal 84 remains low, however.

It is noted that when input signals 12 and 14 transition low at the end of their pulses, inverse output signal 84 does not transition, illustrating the memory of latch circuit 80 described in detail above with reference to FIG. 2.

Although the present invention has been described in detail, it should be understood that various changes, alterations, substitutions and modifications may be made to the teachings described herein without departing from the scope and spirit of the present invention which is solely defined by the appended claims.

What is claimed is:

1. A lock detector circuit comprising:
   a latch circuit operable to generate an output signal in response to the temporal relationship of a first signal and a second signal, wherein the latch circuit comprises:
   a first cross-coupled transistor latch coupled to a first reference potential, and
   a second cross-coupled transistor latch coupled to the first cross-coupled transistor latch and a second reference potential;
   a set circuit coupled to the latch circuit, the set circuit operable to transition the latch circuit to a locked state; and
   a reset circuit coupled to the latch circuit, the reset circuit operable to transition the latch circuit to a not-locked state.

2. The circuit of claim 1, wherein the set circuit comprises:
   a first set transistor coupled to the first signal; and
   a second set transistor coupled to the second signal and the second reference potential, the second set transistor arranged in series with the first set transistor.

3. The circuit of claim 1, wherein the reset circuit comprises:
   an EXCLUSIVE-OR gate having a first input coupled to the first signal and a second input coupled to the second signal; and
   a reset transistor coupled in parallel to a selected one of the first cross-coupled transistor latch and the second cross-coupled transistor latch, the reset transistor operable to receive the reset signal.

4. The circuit of claim 1, further comprising an input circuit coupled to the set circuit and the reset circuit, the input circuit comprising:
   a first inverter having an input coupled to the first signal;
   a first AND gate having a first input coupled to an output of the first inverter and a second input coupled to the first signal;
   a second inverter having an input coupled to the second signal; and
   a second AND gate having a first input coupled to an output of the second inverter and a second input coupled to the second signal.

5. The circuit of claim 1, wherein:
   the first cross-coupled transistor latch comprises a first latch transistor and a second latch transistor, each coupled to the first reference potential and cross-coupled with the other; and
   the second cross-coupled transistor latch comprises a third latch transistor and a fourth latch transistor, each coupled to the second reference potential and cross-coupled with the other.

6. The circuit of claim 1, wherein:
   the first cross-coupled transistor latch comprises p-channel MOSFETs; and
   the second cross-coupled transistor latch comprises n-channel MOSFETs.

7. The circuit of claim 1, wherein the first signal and the second signal have frequencies greater than or equal to one gigahertz.

8. A phase-lock loop circuit comprising:
   a phase detector operable to receive a first signal and a second signal;
   a voltage controlled oscillator coupled to the phase detector and operable to generate the second signal as an output; and
   a lock detector operable to receive the first signal and the second signal, the lock detector comprising:
   a latch circuit operable to generate an output signal in response to the temporal relationship of the first signal and the second signal, wherein the latch circuit comprises:

a first cross-coupled transistor latch coupled to a first reference potential, and a second cross-coupled transistor latch coupled to the first cross-coupled transistor latch and a second reference potential;

a set circuit coupled to the latch circuit, the set circuit operable to transition the latch circuit to a locked state; and a reset circuit coupled to the latch circuit, the reset circuit operable to transition the latch circuit to a not-locked state.

9. The circuit of claim 8, further comprising a charge pump coupled between the phase detector and the voltage controlled oscillator.

10. The circuit of claim 8, wherein the set circuit comprises:

a first set transistor coupled to the first signal; and a second set transistor coupled to the second signal and the second reference potential, the second set transistor arranged in series with the first set transistor.

11. The circuit of claim 8, wherein the reset circuit comprises:

an EXCLUSIVE-OR gate having a first input coupled to the first signal and a second input coupled to the second signal; and a reset transistor coupled in parallel to a selected one of the first cross-coupled transistor latch and the second cross-coupled transistor latch, the reset transistor operable to receive the reset signal.

12. The circuit of claim 8, further comprising an input circuit comprising:

a first inverter having an input coupled to the first signal;

a first AND gate having a first input coupled to an output of the first inverter and a second input coupled to the first signal;

a second inverter having an input coupled to the second signal; and a second AND gate having a first input coupled to an output of the second inverter and a second input coupled to the second signal.

13. The circuit of claim 8 wherein:

the first cross-coupled transistor latch comprises a first latch transistor and a second latch transistor, each coupled to the first reference potential and cross-coupled with the other; and the second cross-coupled transistor latch comprises a third latch transistor and a fourth latch transistor, each coupled to the second reference potential and cross-coupled with the other.

14. The circuit of claim 8, wherein:

the first cross-coupled transistor latch comprises p-channel MOSFETs; and the second cross-coupled transistor latch comprises n-channel MOSFETs.

15. The circuit of claim 8, wherein the first signal and the second signal have a frequency greater than or equal to one gigahertz.

16. A method for detecting whether a first signal and a second signal are in phase lock, the method comprising:

activating a first set transistor in response to the first signal;

activating a second set transistor in response to the second signal; and activating a first latch transistor associated with a first cross-coupled transistor latch and a second latch transistor associated with a second cross-coupled transistor latch in response to simultaneous activation of the first set transistor and the second set transistor.

17. The method of claim 16, further comprising:

generating a reset signal in response to the temporal relationship of the first signal and the second signal;

activating a reset transistor in response to the reset signal; and activating a third latch transistor associated with the first cross-coupled transistor latch and a fourth latch transistor associated with the second cross-coupled transistor latch in response to the activation of the reset transistor.

18. The method of claim 16, further comprising:

generating a reset signal in response to the temporal relationship of the first signal and the second signal, wherein the step of generating the reset signal comprises:

providing the first signal and the second signal to inputs of an EXCLUSIVE-OR gate, and generating the reset signal on the output of the EXCLUSIVE-OR gate;

activating a reset transistor in response to the reset signal; and activating a third latch transistor associated with the first cross-coupled transistor latch and a fourth latch transistor associated with the second cross-coupled transistor latch in response to the activation of the reset transistor.

19. The method of claim 16, wherein:

the first cross-coupled transistor latch comprises p-channel MOSFETs; and the second cross-coupled transistor latch comprises n-channel MOSFETs.

20. The method of claim 16, wherein the first signal and the second signal have frequencies greater than or equal to one gigahertz.

* * * * *